United States Patent
Kim et al.

(10) Patent No.: US 12,399,212 B2
(45) Date of Patent: Aug. 26, 2025

(54) TEST ELEMENT GROUP AND TEST DEVICE INCLUDING THE SAME

(71) Applicant: SAMSUNG ELECTRONICS CO., LTD., Suwon-si (KR)

(72) Inventors: Sunwoo Kim, Ansan-si (KR); Minseob Kim, Suwon-si (KR); Juhyun Kim, Yongin-si (KR)

(73) Assignee: SAMSUNG ELECTRONICS CO., LTD., Suwon-si (KR)

(*) Notice: Subject to any disclaimer, the term of this patent is extended or adjusted under 35 U.S.C. 154(b) by 701 days.

(21) Appl. No.: 17/806,467

(22) Filed: Jun. 10, 2022

(65) Prior Publication Data

US 2022/0413038 A1     Dec. 29, 2022

(30) Foreign Application Priority Data

Jun. 29, 2021    (KR) .................... 10-2021-0084801

(51) Int. Cl.
*G01R 31/28*    (2006.01)
*H01L 21/66*    (2006.01)

(52) U.S. Cl.
CPC .......... *G01R 31/2884* (2013.01); *H01L 22/34* (2013.01)

(58) Field of Classification Search
CPC ............................ H01L 22/34; G01R 31/2884
USPC ...................................................... 257/342
See application file for complete search history.

(56) References Cited

U.S. PATENT DOCUMENTS

| | | | |
|---|---|---|---|
| 6,855,568 B2 | 2/2005 | Weiner et al. | |
| 8,264,235 B2 | 9/2012 | De Vries et al. | |
| 8,599,623 B1 * | 12/2013 | Clark | G01R 35/00 |
| | | | 365/201 |
| 9,046,573 B1 * | 6/2015 | Watt | G11C 29/56008 |
| 9,786,571 B1 | 10/2017 | Zhang | |
| 10,056,469 B1 | 8/2018 | Li et al. | |
| 10,510,623 B2 | 12/2019 | Fang et al. | |
| 2003/0062621 A1 | 4/2003 | Jang et al. | |

(Continued)

FOREIGN PATENT DOCUMENTS

| | | |
|---|---|---|
| CN | 109119350 A | 1/2019 |
| KR | 10-2003-0022612 | 3/2003 |
| KR | 10-2021-0054962 A | 5/2021 |

OTHER PUBLICATIONS

Office Action dated Apr. 29, 2025 issued in Korean Patent Application No. 10-2021-0084801.

*Primary Examiner* — Igwe U Anya
(74) *Attorney, Agent, or Firm* — Morgan, Lewis & Bockius LLP

(57) ABSTRACT

A test device includes semiconductor substrate, gate lines disposed on an upper surface of the semiconductor substrate and extending in a first direction parallel to the upper surface, a test element group including test transistors defined by the gate lines and by active regions extending in a second direction perpendicular to the first direction and intersecting the gate lines, and metal wirings disposed on the semiconductor substrate and electrically connected to the active regions and/or the gate lines, and a test circuit electrically connected to the metal wirings and configured to measure resistance of the test transistors. The gate lines include first gate lines and second gate lines disposed alternately, with the spacing between first gate lines and second gate lines alternating between a first distance and a second distance greater than the first distance.

20 Claims, 11 Drawing Sheets

(56) References Cited

U.S. PATENT DOCUMENTS

| | | | |
|---|---|---|---|
| 2003/0185074 A1* | 10/2003 | Nakamura | G11C 29/50016 365/201 |
| 2004/0076056 A1* | 4/2004 | Chang | H10B 12/09 257/E21.654 |
| 2010/0013513 A1* | 1/2010 | Lee | H01L 22/34 257/E23.002 |
| 2012/0187403 A1* | 7/2012 | Lee | H01L 22/34 257/E23.01 |
| 2015/0140698 A1 | 5/2015 | Yamashita et al. | |
| 2019/0384185 A1 | 12/2019 | Lo et al. | |
| 2020/0258892 A1* | 8/2020 | Chiu | G11C 29/08 |
| 2020/0321334 A1 | 10/2020 | Song et al. | |
| 2021/0134784 A1 | 5/2021 | Kim et al. | |

* cited by examiner

TEST ELEMENT GROUP AND TEST DEVICE INCLUDING THE SAME

CROSS TO REFERENCE TO RELATED APPLICATION

This U.S. non-provisional application claims priority under 35 USC § 119 to Korean Patent Application No. 10-2021-0084801 filed on Jun. 29, 2021 in the Korean Intellectual Property Office, the disclosure of which is incorporated by reference herein in its entirety.

TECHNICAL FIELD

Embodiments of the present disclosure generally relate to semiconductor integrated circuits, and more particularly to a test element group and a test device including the same.

DISCUSSION OF THE RELATED ART

A plurality of integrated circuit chips may be formed on a semiconductor substrate such as a wafer by performing a semiconductor thin film process. The semiconductor thin film process may form a plurality of dies on a semiconductor substrate, and then the substrate may be cut so individual integrated circuit chips can be manufactured.

A pattern of test elements such as a test element group (TEG) may be formed in a predetermined region included in a semiconductor substrate or an integrated circuit chip, and electrical properties of various elements included in the integrated circuit chip may be identified using the pattern. For example, the TEG may be tested for short circuits, current leaks, incorrect voltages, and other unexpected characteristics. The TEG may be sacrificial, and used to identify defects in other parts of the integrated circuit chip. However, a considerable amount of time and resources may be used for manufacturing, destroying, and analyzing the elements to identify electrical properties of the elements using some test element groups.

SUMMARY

An example embodiment of the present disclosure provides a test element group which may reduce the period of process development and decrease a defect rate of a product, and a test device including the same. The example embodiment forms a test element group having a structure in which defects may easily occur in a process of artificially forming a contact connected to an active region, so as to detect contact defects early before the manufacturing of an integrated circuit chip is completed.

According to an example embodiment of the present disclosure, a test device includes a semiconductor substrate; a plurality of gate lines disposed on an upper surface of the semiconductor substrate and extending in a first direction parallel to the upper surface; a test element group including a plurality of test transistors defined by the plurality of gate lines and by a plurality of active regions intersecting the plurality of gate lines and extending in a second direction parallel to the upper surface and perpendicular to the first direction, and further including a plurality of metal wirings disposed on the semiconductor substrate and electrically connected to the plurality of active regions and/or the plurality of gate lines; and a test circuit electric ally connected to a portion of the plurality of metal wirings and configured to measure resistance of the plurality of test transistors, wherein the plurality of gate lines include a plurality of first gate lines and a plurality of second gate lines, wherein each of the plurality of first gate lines is disposed alternately with each of the plurality of second gate lines, wherein each of the plurality of first gate lines is spaced apart by a first distance from one of the plurality of second gate lines in the second direction on one side, and is spaced apart by a second distance greater than the first distance from another second gate line of the plurality of second gate lines in the second direction on the other side.

According to an example embodiment of the present disclosure, a test element group includes a plurality of gate lines extending in a first direction parallel to an upper surface of a semiconductor substrate, and including a plurality of first gate lines and a plurality of second gate lines, wherein each of the plurality of first gate lines is disposed alternately with each of the plurality of second gate lines; a plurality of test transistors defined by the plurality of gate lines; a plurality of active regions intersecting the plurality of gate lines and spaced apart from each other in the first direction; and a plurality of metal wirings disposed on the semiconductor substrate and electrically connected to the plurality of active regions and/or the plurality of gate lines, wherein each of the plurality of first gate lines is spaced apart by a first distance from one of the plurality of second gate lines on one side, wherein each of the plurality of first gate lines is spaced apart by a second distance greater than the first distance from another one of the plurality of second gate lines on the other side in the second direction, and wherein the second direction is parallel to the upper surface of the semiconductor substrate and perpendicular to the first direction.

According to an example embodiment of the present disclosure, a test element group includes a plurality of gate lines extending in a first direction parallel to an upper surface of a semiconductor substrate and including a plurality of first gate lines and a plurality of second gate lines, wherein each of the plurality of first gate lines is disposed alternately with each of the plurality of second gate lines; a plurality of test transistors defined by the plurality of gate lines, and by a plurality of active regions intersecting the plurality of gate lines, the plurality of active regions spaced apart from each other in the first direction; a plurality of metal wirings disposed on the semiconductor substrate and electrically connected to the plurality of active regions and/or the plurality of gate lines; and a plurality of contacts connecting at least one of the plurality of metal wirings to at least one of the plurality of active regions, wherein each of the plurality of first gate lines is spaced apart by a first distance from one of the plurality of second gate lines on one side in a second direction, and is spaced apart by a second distance greater than the first distance from another one of the plurality of second gate lines on the other side in the second direction, wherein the second direction is parallel to the upper surface of the semiconductor substrate and perpendicular to the first direction, and wherein a distance between adjacent contacts among the plurality of contacts is different from the first distance and the second distance.

BRIEF DESCRIPTION OF DRAWINGS

The above and other aspects and features of the present disclosure will be more clearly understood from the following detailed description, taken in conjunction with the accompanying drawings, in which.

DETAILED DESCRIPTION

Figure 1:
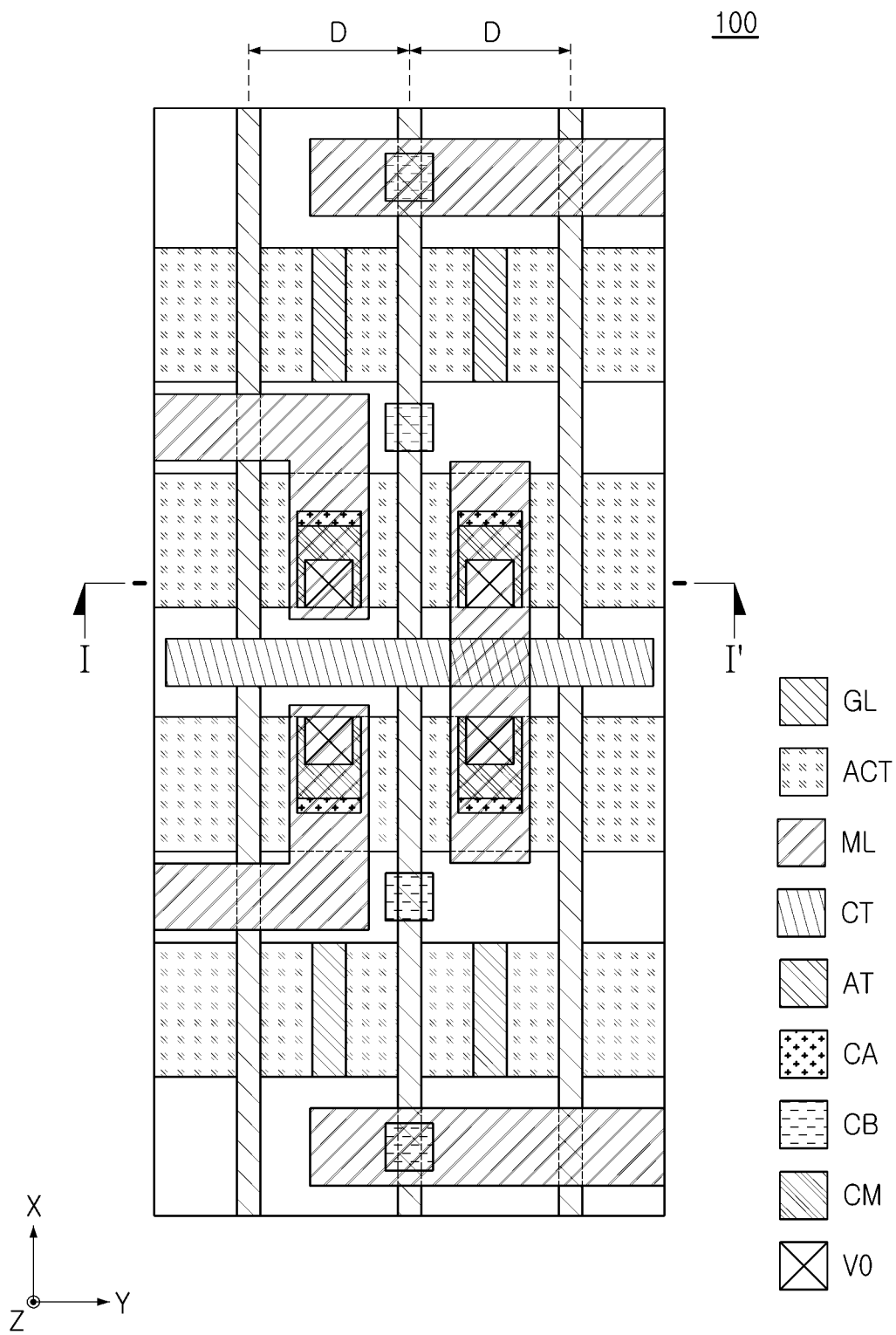
FIGS. 1 and 2 are diagrams that illustrate a test element group for performing a test process.

Hereinafter, embodiments of the present disclosure will be described as follows with reference to the accompanying drawings. Like reference symbols in the drawings may denote like elements, and to the extent that a description of an element has been omitted, it may be understood that the element is at least similar to corresponding elements that are described elsewhere in the specification. Additionally, description of a singular element may apply to a plurality of the same elements, unless the context of the description or referenced drawings indicates otherwise.

Figure 2:
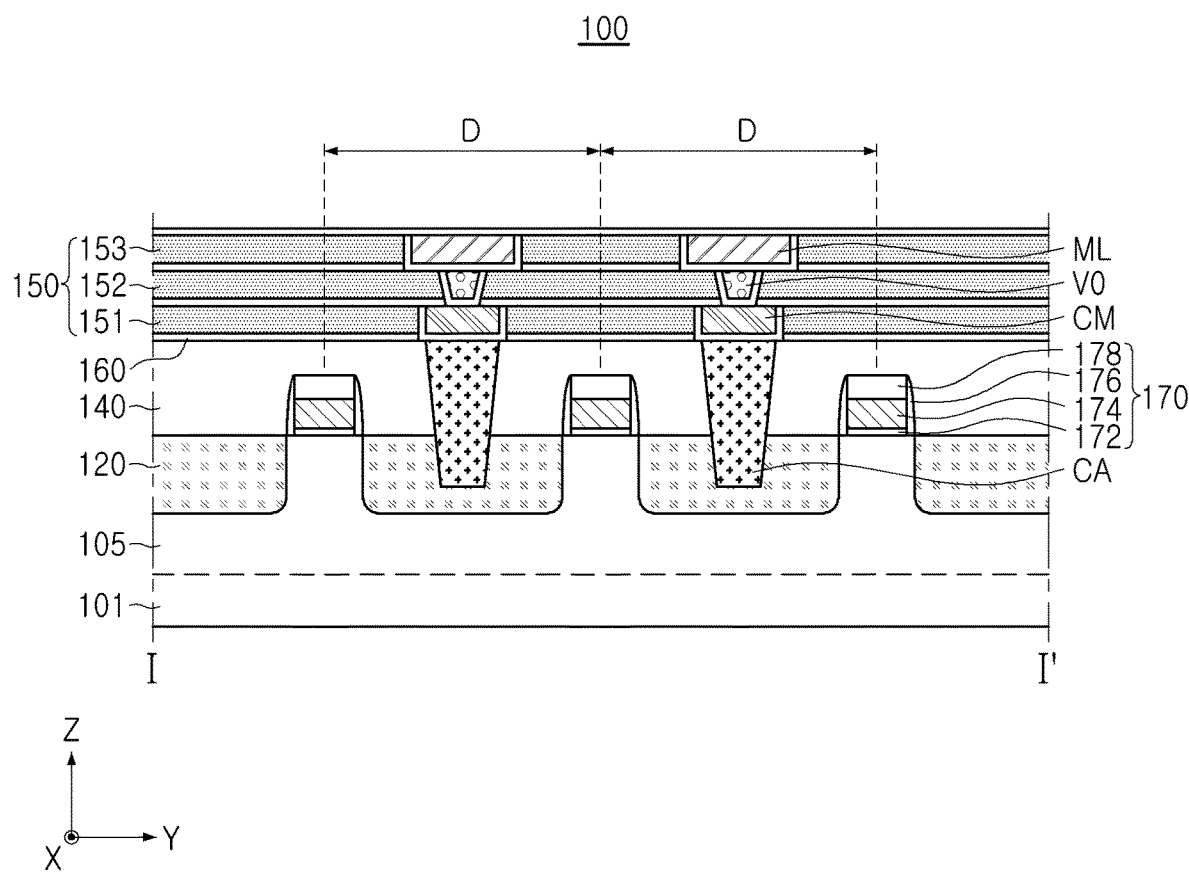

FIGS. 1 and 2 are diagrams that illustrate a test element group for performing a test process.

FIG. 1 is a diagram that illustrates an example of a test element group 100 formed in one region of a semiconductor device, wherein the semiconductor device includes integrated circuit chips. For example, the semiconductor device may include a plurality of chip regions in which integrated circuit chips are formed and a scribing region defined between the plurality of chip regions.

At least one integrated circuit chip may be formed in each of the plurality of chip regions. For example, various circuit devices such as a resistor, a capacitor, a transistor, and a diode may be formed in each of the plurality of chip regions. The plurality of chip regions may be arranged along a plurality of rows and columns.

The scribing region may be used for performing a scribing process in which individual integrated circuit chips are formed by separating the plurality of chip regions. Accordingly, circuit devices included in the integrated circuit chip might not be formed in the scribing region.

A plurality of semiconductor processes may be performed to form integrated circuit chips in the plurality of chip regions. When the plurality of semiconductor processes are not performed properly, defects such as open circuits or shorts may occur, which can degrade performance of the integrated circuit chip. Accordingly, there is a need for a method for determining whether the plurality of semiconductor processes have been properly performed on the formed integrated circuit chip.

For example, to determine whether a semiconductor process for manufacturing an integrated circuit chip is appropriate for the integrated circuit chip, the test element group 100 may be provided in the scribing region. For example, the test element group 100 may include devices formed together with devices such as capacitors, resistors, and transistors, included in the integrated circuit chip.

In the process of forming a circuit device in the integrated circuit chip, a plurality of test transistors used to perform a test process may be formed in a scribing region. For example, the plurality of test transistors may be connected to pads formed in the scribing region, and the test device performing the test process may detect a current and/or voltage from at least one of the pads and may inspect whether the test transistors are defective based on the detection.

Referring to FIG. 1, the test element group 100 may include a plurality of test transistors disposed on a semiconductor substrate in a first direction (e.g., X-direction) and second direction (e.g., Y-direction), a plurality of metal wirings ML, and other devices.

For example, a plurality of test transistors included in the test element group 100 may be defined by a plurality of gate lines GL and a plurality of active regions ACT. The plurality of gate lines GL may be arranged spaced apart from each other in the second direction and may extend in the first direction. The plurality of active regions ACT may extend in a continuous pattern in a second direction and intersect the plurality of gate lines GL, and may be arranged and spaced apart from each other in the first direction.

The plurality of gate lines GL included in the test element group 100 illustrated in FIG. 1 may be spaced apart from each other with the same distance therebetween in the second direction. For example, each of the plurality of gate lines GL may be spaced apart from each other by a predetermined distance D.

The plurality of test transistors may be provided based on regions in which the plurality of gate lines GL overlap the plurality of active regions ACT. The plurality of active regions ACT may provide source/drain regions and channel regions for the plurality of test transistors. For example, a region in which the plurality of active regions ACT overlap the plurality of gate lines GL may include channel regions of the plurality of test transistors.

The plurality of metal wirings ML may be disposed on the plurality of active regions ACT and the plurality of gate lines GL, and may extend in the first direction and the second direction. However, embodiments thereof are not necessarily limited thereto, and an extension direction(s) of the plurality of metal wirings ML may be varied according to embodiments.

The test element group 100 illustrated in FIG. 1 may include gate isolation patterns CT, active region isolation patterns AT, and a plurality of contacts CA, CB, CM, and V0. The plurality of gate lines GL may be separated by the gate isolation patterns CT that extend in the second direction, and the plurality of active regions ACT may be separated by the active region isolation patterns AT.

The plurality of contacts CA, CB, CM, and V0 may include a plurality of active contacts CA, CM, and V0 electrically connecting the plurality of active regions ACT to the plurality of metal wirings ML, and a plurality of gate contacts CB electrically connecting the plurality of gate lines GL to the plurality of metal wirings ML. Herein, the plurality of gate contacts CB may be referred to as the second contact CB.

In some embodiments, the test element group 100 may include power lines for driving the plurality of test transistors. The power lines may be disposed on a level higher than a level of the plurality of metal wirings ML and be electrically connected to the plurality of metal wirings ML. The power lines may be electrically connected to source/drain regions formed on the plurality of active regions ACT via a plurality of contacts.

FIG. 2 is a cross-sectional diagram taken along line I-I' in FIG. 1. For example, each of the plurality of test transistors included in the test element group 100 may include at least one fin structure providing the active region 105. For example, the test element group 100 may include FinFET devices in which the active regions 105 may be configured as transistors including active fins having a fin structure.

Referring to FIG. 2, the test element group 100 may include a substrate 101, an active region 105 including active fins, source/drain regions 120, a lower interlayer insulating layer 140, upper interlayer insulating layers 151, 152, and 153 (e.g., 150 comprises 151, 152, and 153), an etch stop layer 160, and gate structures 170.

The active region 105 and the source/drain regions 120 included in the test element group 100 illustrated in FIG. 2 may correspond to the plurality of active regions ACT included in the test element group 100 illustrated in FIG. 1, and the gate structures 170 may correspond to the plurality of gate lines GL. Accordingly, the gate structures 170 may be spaced apart from each other by a predetermined distance D.

Referring to FIG. 2, in the test element group 100, the source/drain regions 120 may be electrically connected to the plurality of metal wirings ML by the plurality of active contacts CA, CM, and V0 which penetrate upper interlayer insulating layers 150 and contact a portion of the source/drain regions 120.

The plurality of active contacts CA, CM, and V0 may be divided into a first contact CA, a lower contact CM, and a lower via V0 according to a level on which the plurality of active contacts are formed. For example, the first contact CA may be directly connected to the source/drain regions 120, the lower contact CM may be disposed on the first contact CA, and the lower via V0 may connect the lower contact CM to the plurality of metal wirings ML.

The first contact CA may be formed by performing an etching process on a portion of the lower interlayer insulating layer 140, and filling the space removed by the etching process with a conductive material. Similarly, the lower contact CM and the lower via V0 may be formed on the same level as a level of the first upper interlayer insulating layer 151 and the second upper interlayer insulating layer 152.

The gate structures 170 included in the test element group 100 may include a gate insulating layer 172, a gate electrode layer 174, a gate spacer layer 176, and a gate capping layer 178. However, the cross-sectional surface of the test element group 100 illustrated in FIG. 2 is merely an example, and the configuration of the test element group 100 according to embodiments is not necessarily limited to the configuration as illustrated in the example.

Figure 3:
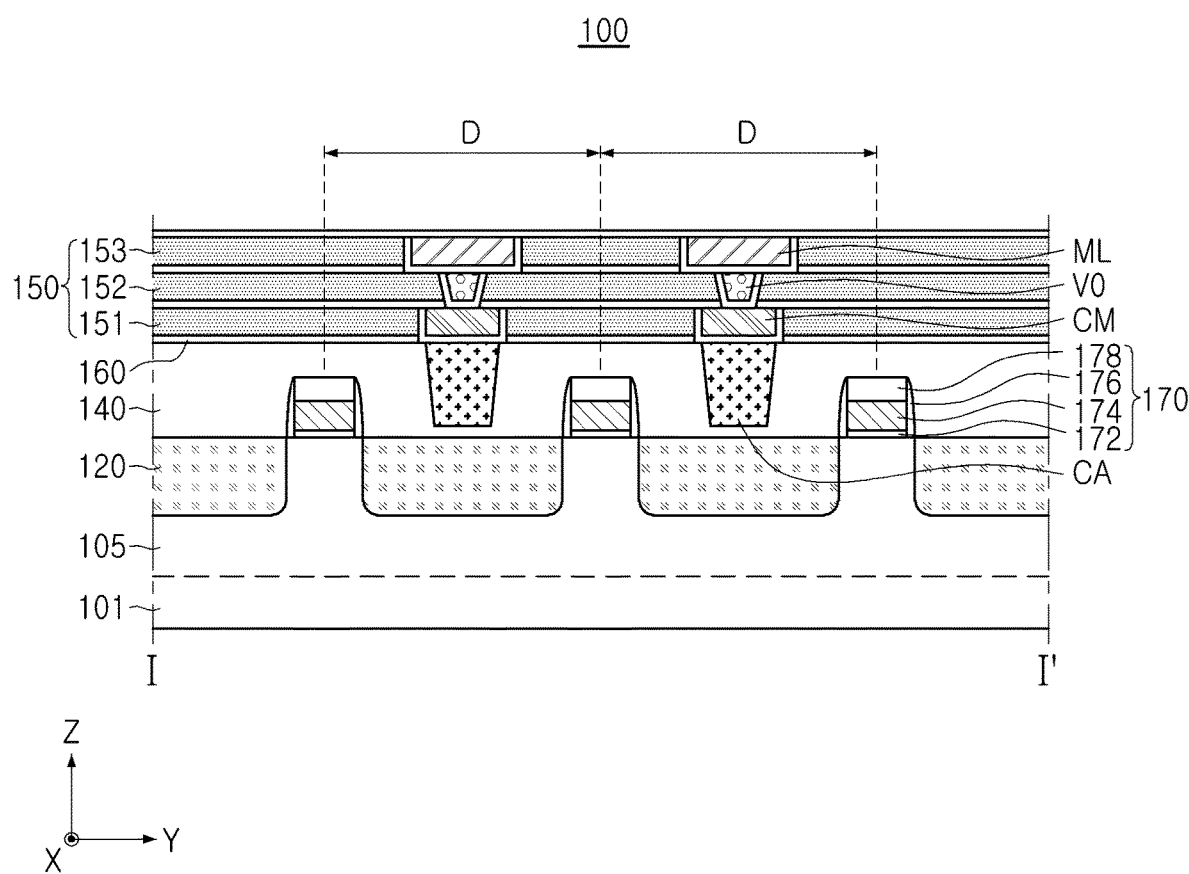
FIG. 3 is a diagram that illustrates defects occurring in a semiconductor device.

FIG. 3 is a diagram that illustrates defects occurring in a semiconductor device.

FIG. 3 illustrates a contact open defect which may occur in a process of forming the first contact CA connected to the source/drain regions 120 of the active region 105 among a plurality of processes that are used to manufacture a semiconductor device.

Referring to FIG. 3, an open defect in which the first contact CA and the source/drain regions 120 are not connected to each other may occur due to an error occurring in a process of forming a plurality of transistors included in a semiconductor device.

A test device including a plurality of test transistors may be used to determine if a manufacturing process used for a semiconductor device is prone to cause defects. For example, a defect occurring in the plurality of transistors included in the semiconductor device may similarly occur in the plurality of test transistors included in the test device, where the test device includes similar circuits and/or chips to the semiconductor device. For example, the source/drain regions 120 of the plurality of test transistors adjacent to each other may be connected to each other via the plurality of active contacts CA, CM, and V0 and the plurality of metal wirings ML, and an open defect may occur when at least a portion of the source/drain regions 120 are not connected to the first contact CA.

As described above, the first contact CA may be formed by filling a conductive material in the space removed from the lower interlayer insulating layer 140 after an etching process is performed thereon. Accordingly, when the lower interlayer insulating layer 140 is not sufficiently removed by the etching process, an open defect in which the first contact CA and the source/drain regions 120 are separated from each other may occur as illustrated in FIG. 3. For example, this defect may occur when the etching process doesn't remove enough of the lower interlayer insulating layer 140 to expose the source/drain regions 120.

In an example embodiment, an open defect in which the first contact CA and the source/drain regions 120 are separated from each other may be detected early in the manufacturing of a semiconductor device by using the test element group including a plurality of gate lines spaced apart from each other by different distances. For example, by way of contrast from a comparative test element group that performs a defect test after manufacturing of a semiconductor device is completed, the test device in an example embodiment according to the present disclosure may include a test element group which may perform an open defect test of the first contact during a process of manufacturing the semiconductor device. Accordingly, by providing feedback on a process design using the test device in the example embodiment, the process development period may be shortened and, a defect rate of the product may be reduced early.

Figure 4:
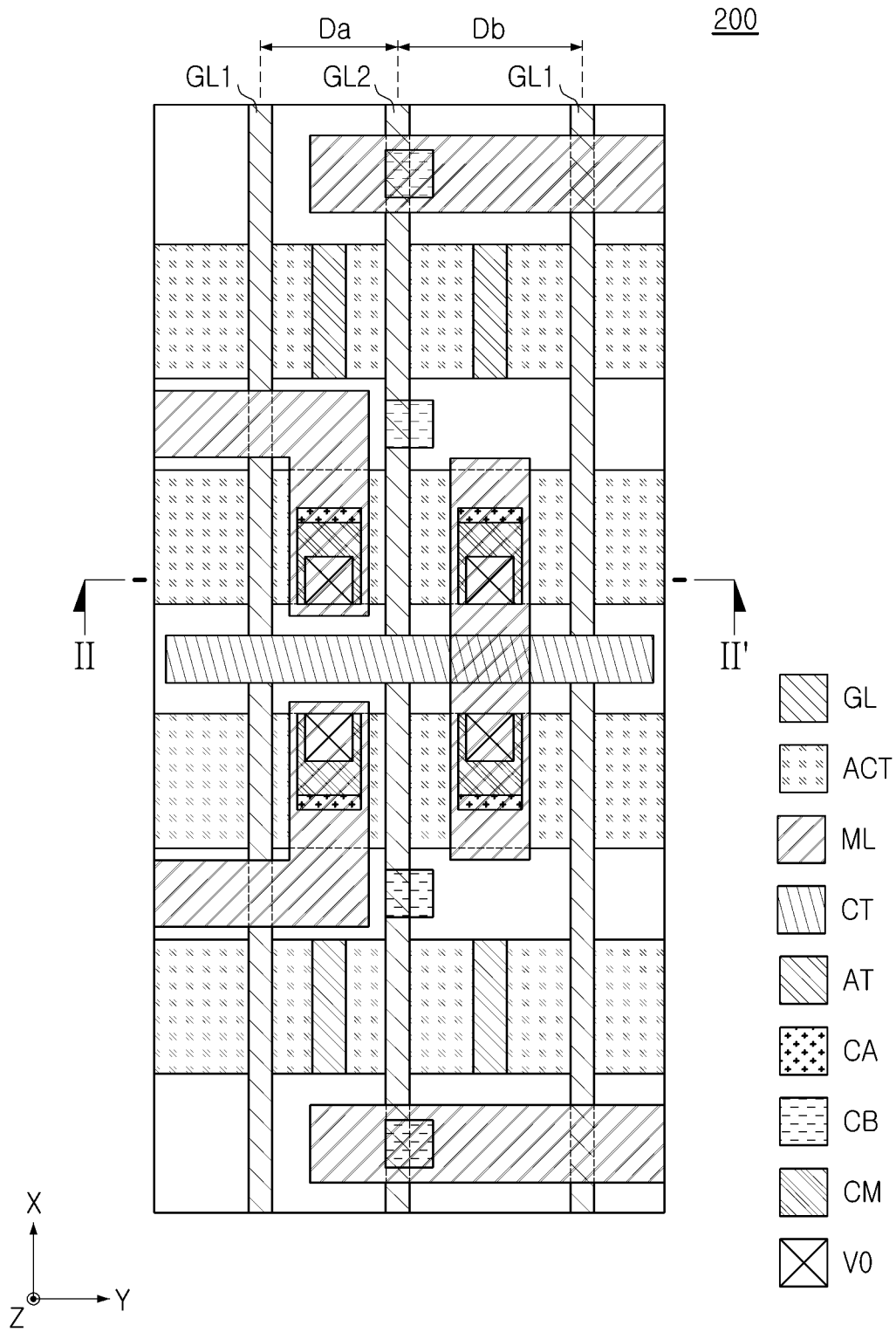
FIG. 4 is a diagram that illustrates a test element group according to an example embodiment of the present disclosure.

FIG. 4 is a diagram that illustrates a test element group according to an example embodiment.

Referring to FIG. 4, components included in the test element group 200 in an example embodiment may correspond to the components of the test element group 100 illustrated in FIG. 1. For example, the test element group 200 may include a plurality of gate lines GL, a plurality of active regions ACT, a plurality of metal wirings ML, a gate isolation pattern CT, an active region isolation pattern AT, a plurality of active contacts CA, CM, and V0, and a plurality of gate contacts CB.

The plurality of active regions ACT may be spaced apart from each other (e.g., arranged) in the first direction, and may extend in the second direction and intersect the plurality of gate lines GL. The plurality of metal wirings ML may be disposed on the semiconductor substrate and may be electrically connected to at least one of the plurality of active regions ACT and/or the plurality of gate lines GL.

The plurality of metal wirings ML may be connected to the plurality of active regions ACT via the plurality of active contacts CA, CM, and V0. For example, the plurality of metal wirings ML may be connected to the plurality of active regions ACT in a third direction (e.g., Z-direction) via the plurality of active contacts CA, CM, and V0. The plurality of metal wirings ML may be connected to the plurality of gate lines GL via the plurality of gate contacts CB, for example, in the third direction.

The test element group 200 may include a plurality of test transistors defined by the plurality of gate lines GL and the plurality of active regions ACT. For example, the plurality of test transistors may be connected to each other in series, and during the test process, the plurality of test transistors may operate as a pass gate.

The test device including the test element group 200 in an example embodiment may determine whether an open defect of the contact CA is present by turning on a plurality of test transistors connected to each other in series and measuring resistance of the plurality of test transistors. For example, while the test process is performed, the test element group 200 may be electrically connected to the test circuit via a plurality of pads.

In the test element group 200 in an example embodiment, the plurality of gate lines GL may extend in the first direction (e.g., X direction) parallel to the upper surface of the semiconductor substrate, and may include a plurality of first gate lines GL1 and a plurality of second gate lines GL2. In an embodiment, each of the plurality of first gate lines GL1 are alternately disposed to each of the plurality of second gate lines GL2, such that two first gate lines GL1 are adjacent to a second gate line GL2.

In the test element group 200 in an example embodiment, the plurality of gate lines GL may be spaced apart from each other by different distances. For example, each of the plurality of first gate lines GL1 may be spaced apart from one of the plurality of second gate lines GL2 by a first distance Da on one side in the second direction. Each of the plurality of first gate lines GL1 may be spaced apart from one of the plurality of second gate lines GL2 by a second distance Db on the other side in the second direction. The second distance Db may be greater than the first distance Da. For example, the second distance Db may be greater than the first distance Da by about 2 nm to 8 nm. However, the difference between the first distance Da and the second distance Db is not necessarily limited thereto.

The other components of the test group 200 may correspond to the components included in the test element group 100 illustrated in FIG. 1 regardless of the spacing distance between the plurality of gate lines GL. For example, the first contact CA disposed on the plurality of active regions ACT may be spaced apart from the adjacent gate lines GL1 and GL2 of the plurality of gate lines GL by the same distance. Accordingly, a sum of the first distance Da and the second distance Db may have a predetermined value regardless of the relative lengths of each of the first distance Da and the second distance Db.

The test element group 200 illustrated in FIG. 4 may accelerate the open defect issue occurring in the first contact CA when the plurality of semiconductor processes are performed. For example, the open defect issue may be accelerated in the first contact CA formed in a region between the gate lines GL1 and GL2 spaced apart from each other, since the spacing between the gate lines GL1 and GL2 on one side is a relatively small first distance Da. For example, the first contact CA formed in the region between the gate lines GL1 and GL2 spaced apart from each other by the first distance Da may be defective even by slight shaking occurring during the semiconductor process.

Accordingly, the test device including the test element group 200 in an example embodiment may perform a contact defect test before a process of forming a constituent structure of the semiconductor device, disposed on the plurality of metal wirings ML, is performed. For example, the test device may, after the plurality of metal wirings ML are formed using the test circuit, measure resistances of the plurality of test transistors before the manufacturing of the semiconductor device is completed. The test device may determine whether an open defect issue occurs in the first contact CA formed in one of the plurality of test transistors based on the measured resistance.

However, the structure of the test element group 200 is not necessarily limited to the illustrated example in FIG. 4. For example, the test element group 200 may include a larger number of test transistors than the example illustrated in FIG. 4. For example, the test element group 200 may include about 4000 to 5000 test transistors. Accordingly, this an example embodiment and the present disclosure is not necessarily limited thereto, and the test element group 200 may include less than 4000 or more than 5000 test transistors.

When a defect occurs in the first contact CA formed in one of the plurality of test transistors connected to each other in series, the resistance of the all test transistors may greatly increase. For example, when the measured resistance is about 5 kohm or less, it may be determined that a defect does not occur in the first contact CA formed in the plurality of test transistors. If the measured resistance is between about 30 kohm and 10 Gohm, it may be determined that a defect occurs in the first contact CA formed on at least one of the plurality of test transistors.

The test element group 200 in an example embodiment may increase sensitivity of defect detection by connecting a large number of test transistors to each other in series.

Also, the layout of the test element group 200 illustrated in FIG. 4 is merely an example embodiment and the layout is not necessarily limited thereto. Accordingly, the test element group may be provided in various layouts in example embodiments. As an example, the configurations and properties of the test element group 200 illustrated in FIG. 4 may appear in at least a portion of the plurality of gate lines GL.

The plurality of gate lines GL may have different shapes, and a portion of the gate lines may be dummy gate lines disposed for distinguishing from neighboring semiconductor devices and/or layout if desired. Also, the thickness, spacing, shape, or the like, of the plurality of gate lines GL and the plurality of active regions ACT included in the test element group 10 illustrated in FIG. 4 is not necessarily limited to the examples illustrated in FIG. 4.

Figure 5:
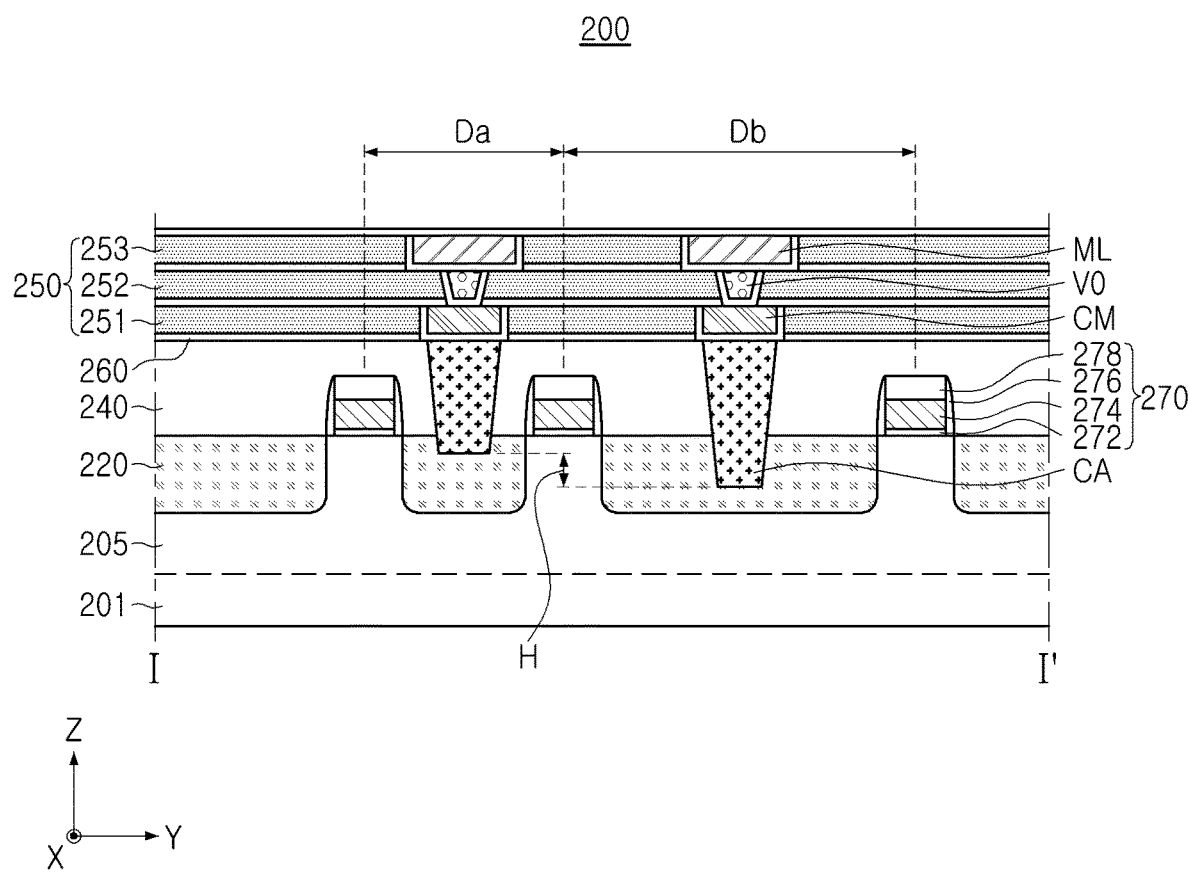
FIG. 5 is a cross-sectional diagram that illustrates a test element group according to an example embodiment of the present disclosure.

FIG. 5 is a cross-sectional diagram that illustrates a test element group according to an example embodiment.

FIG. 5 is a cross-sectional diagram taken along line II-IF in FIG. 4. The components included in the test element group 200 in an example embodiment may correspond to the components of the test element group 100 illustrated in FIG. 2. For example, the test element group 200 may include a substrate 201, an active region 205 including active fins, source/drain regions 220, a lower interlayer insulating layer 240, an upper interlayer insulating layer 251, 252, and 253 (e.g., 250 comprises 251, 252, and 253), an etch stop layer 260, and gate structures 270.

The active region 205 and the source/drain regions 220 included in the test element group 200 illustrated in FIG. 5 may correspond to the plurality of active regions ACT included in the test element group 200 illustrated in FIG. 4, and the gate structures 270 may correspond to the plurality of gate lines GL. For example, a portion of the gate structures 270 may correspond to the plurality of first gate lines GL1, and a portion of the gate structures 270 may correspond to the plurality of second gate lines GL2. Accordingly, as for the spacing distance between the gate structures 270, the first distance Da and the second distance Db may alternate similarly as described with reference to FIG. 4.

In the test element group 200 in an example embodiment, the substrate 201 may have an upper surface which extends in the first direction and the second direction. The substrate 201 may include a semiconductor material, such as, for example, a group IV semiconductor, a group III-V compound semiconductor, or a group II-VI compound semiconductor. For example, the group IV semiconductor may include silicon, germanium, or silicon-germanium. The substrate 201 may include doped regions such as an N-well region.

The active region 205 may extend in the second direction. The active region 205 may include active fins protruding from the substrate 201. The active fins may be formed as a portion of the substrate 201, and may include an epitaxial layer grown from the substrate 201.

For example, the test element group 200 may include FinFET devices in which active fins are configured as transistors having a fin structure. FinFET devices may include active fins which intersect each other and a plurality of test transistors disposed around gate structures 270. For example, each of the plurality of test transistors may include at least one fin structure providing the active region 205.

The plurality of test transistors may include source/drain regions 220 and gate structures 270 formed on a fin structure of a semiconductor substrate.

The source/drain regions 220 may include epitaxial layers, and may include, for example, silicon (Si), silicon germanium (SiGe), or silicon carbide (SiC). The source/drain regions 120 may further include impurities such as arsenic (As) and/or phosphorus (P). For example, the source/drain regions 120 may include a plurality of regions including different concentrations of an element and/or a doping element.

The gate structures 270 may include a gate insulating layer 272, a gate electrode layer 274, a gate spacer layer 276, and a gate capping layer 278. However, the stacked structure of the gate structures 270 included in each of the plurality of test transistors is not necessarily limited to the example illustrated in FIG. 5, and may be varied in other embodiments.

In the test element group 200 in an example embodiment, the gate structures 270 may be spaced apart from each other by different distances. For example, referring to FIG. 4 together with FIG. 5, one of the gate structures 270 may be adjacent to the gate structure separated by a first distance Da on one side in the second direction. The gate structure may be adjacent to the gate structure separated by a second distance Db, which is greater than the first distance Da, on the other side in the second direction.

In the test element group 200 in an example embodiment, the lower interlayer insulating layer 240 may cover the source/drain regions 220 and the gate structures 270. For example, the lower interlayer insulating layer 240 may include at least one of an oxide, a nitride, and an oxynitride, and may include a material having a low dielectric constant.

The source/drain regions 220 may be connected to the first contact CA penetrating the lower interlayer insulating layer 240. The first contact CA may be formed by removing a portion of the lower interlayer insulating layer 240 surrounding the gate structures 270 by an etching process, and filling a conductive material in the space removed by the etching process. For example, the first contact CA may include a metal material such as tungsten (W), aluminum (Al), or copper (Cu) or a semiconductor material such as doped polysilicon.

The first contact CA may apply an electrical signal to the source/drain regions 220, and the first contact CA may be recessed into the source/drain regions 220 by a predetermined depth, but embodiments of the present disclosure are not necessarily limited thereto.

Since the gate structures 270 included in the test element group 200 in an example embodiment have different spacing distances, the shape of the first contact CA formed in the region in which the first gate structures 270 are spaced apart from each other may vary. For example, the shape of the first contact CA may vary according to the spacing distance of the gate structures 270 between which the first contact CA is disposed.

For example, the length of the first contact CA in a region in which the gate structures 270 are spaced apart from each other by the first distance Da in the third direction (e.g., the Z direction) may be less than the length of the first contact CA in the region in which the gate structures 270 are spaced apart from each other by the relatively larger second distance Db. This total length of the first contact CA in the third direction may be referred to as a penetrating length of the first contact CA. In other words, the length of the first contact CA disposed between a pair of gate structures 270 spaced apart from each other by the first distance Da is less than the length of the first contact CA disposed between another pair of the gate structures 270 spaced apart from each other by the second distance Db. Accordingly, an open defect may easily occur in the first contact CA formed in the region in which the gate structures 270 are spaced apart from each other by the first distance Da during the semiconductor process.

In the test element group 200 in an example embodiment, an upper interlayer insulating layer 250 may be formed on the gate structures 270 and the first contact CA. The upper interlayer insulating layer 250 may include a first upper interlayer insulating layer 251, a second upper interlayer insulating layer 252, and a third upper interlayer insulating layer 253 stacked sequentially, and each of the insulating layers may be separated by an etch stop layer 260. For example, the etch stop layer 260 may stop etching in an etching process that is used to form the lower contact CM, the lower via V0, and the plurality of metal wirings ML.

The upper interlayer insulating layer 250 may be disposed on the same level as a level of the lower contact CM, the lower via V0, and the plurality of metal wirings ML. For example, the first upper interlayer insulating layer 251 and the lower contact CM may be disposed on the same level, the second upper interlayer insulating layer 252 and the lower via V0 may be disposed on the same level, and the third upper interlayer insulating layer 253 and the plurality of metal wirings ML may be disposed on the same level.

For ease of description, only some components of the test element group 200 are illustrated in FIG. 5. As an example, the layers up to level M1 are illustrated in FIG. 5, but embodiments are not limited to the components illustrated in FIG. 5. Also, the illustrated arrangement of the main components and the plurality of metal wirings ML is according to an example embodiment, and the present disclosure is not necessarily limited thereto.

Figure 6:
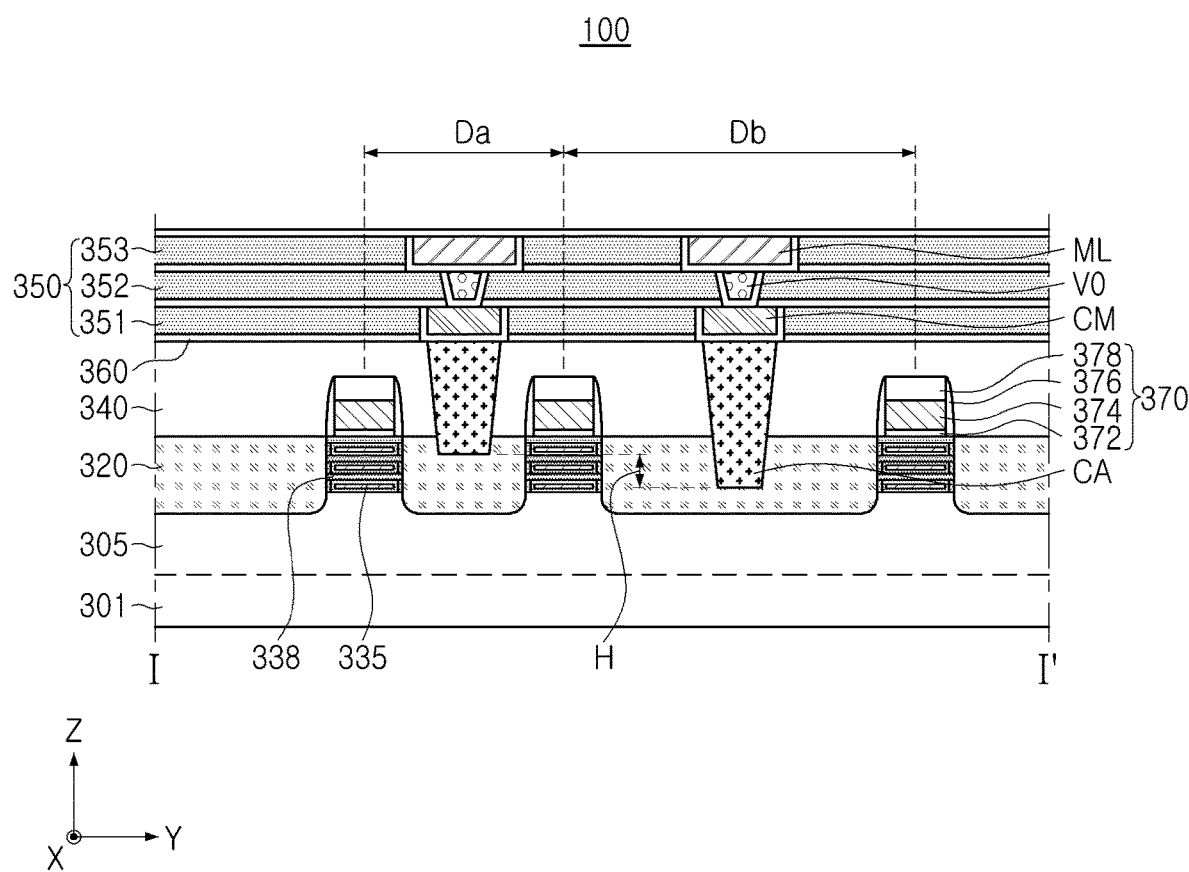
FIG. 6 is a cross-sectional diagram that illustrates a test element group according to an example embodiment of the present disclosure.

FIG. 6 is a cross-sectional diagram that illustrates a test element group according to an example embodiment.

Referring to FIG. 6, a test element group 300 in an example embodiment may correspond to the test element group 200 illustrated in FIG. 5. For example, the test element group 300 may include a substrate 301, an active region 305, source/drain regions 320, a lower interlayer insulating layer 340, upper interlayer insulating layers 351, 352, and 353 (350), an etch stop layer 360, and gate structures 370.

The test element group 300 may include a plurality of active contacts CA, CM, and V0 and a plurality of metal wirings ML for applying an electrical signal to the source/drain regions 320.

Each of the gate structures 370 may include a gate insulating layer 372, a gate electrode layer 374, a gate spacer layer 376, and a gate capping layer 378. Each of the gate structures 370 may be disposed adjacent to one gate structure spaced apart from it by the first distance Da on one side, and adjacent to another gate structure spaced apart from it by the second distance Db on the other side.

However, differently from the test element group 200 illustrated in FIG. 5, the test element group 300 illustrated in FIG. 6 may further include a plurality of channel layers 335 having a nanosheet-shape, where each of the plurality of channel layers 335 is spaced apart from one another on the active region 205, and where internal spacer layers 338 are disposed between the plurality of channel layers 335. For example, the test element group 300 may include transistors of a multi bridge channel FET (MBCFET) structure formed by the plurality of channel layers 335, the source/drain regions 320, and the gate structures 370. For example, each of the plurality of test transistors included in the test element group 300 may include at least one nanosheet providing the active region 305.

However, the structure of the test element group 300 illustrated in FIG. 6 is an example, and embodiments are not necessarily limited thereto. For example, the number and shape of the plurality of channel layers 335 included in a single channel structure may be varied in example embodiments.

Figure 7:
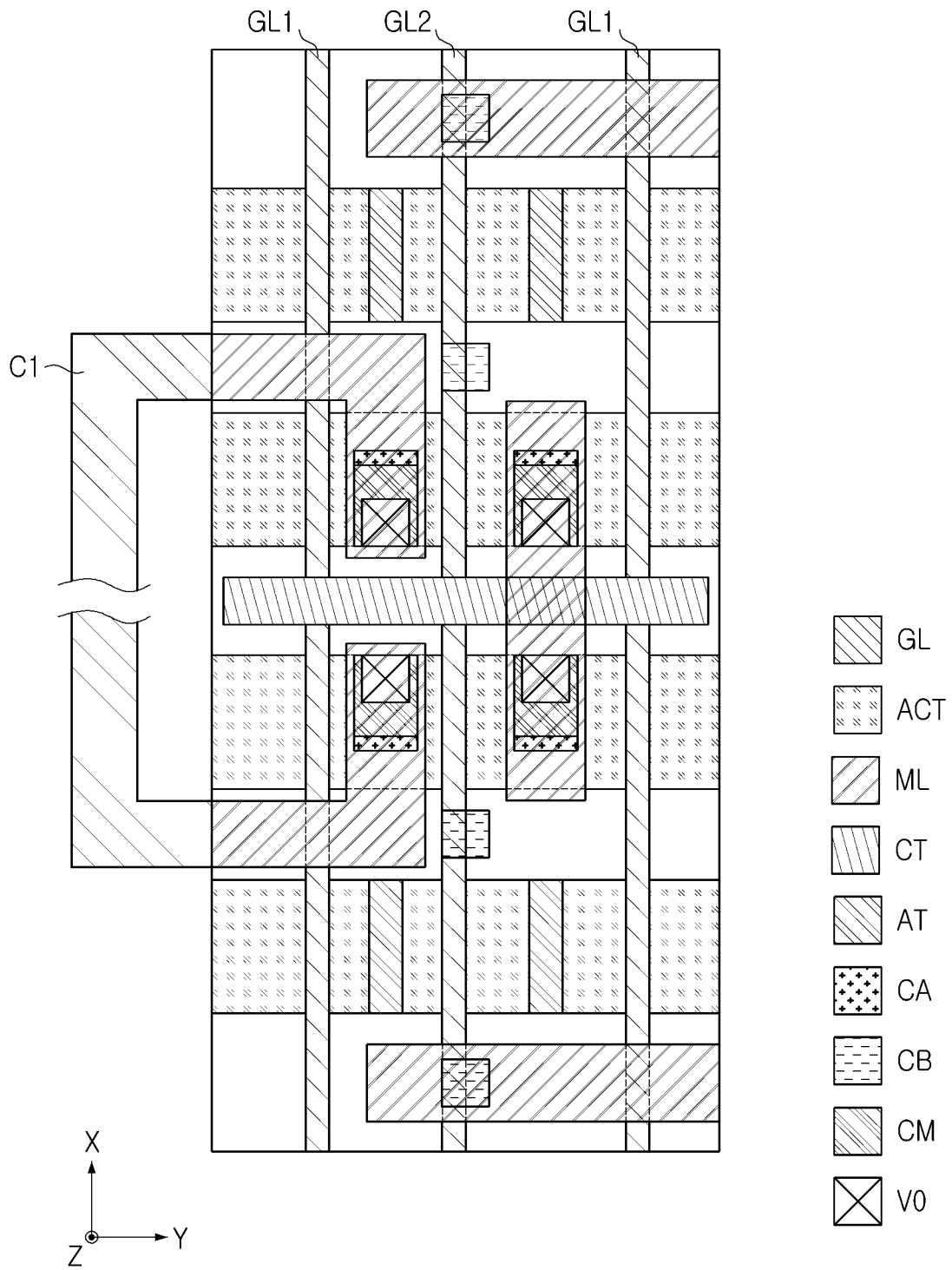
FIGS. 7 and 8 are diagrams that illustrate a test device including a test element group according to an example embodiment of the present disclosure.
Figure 8:
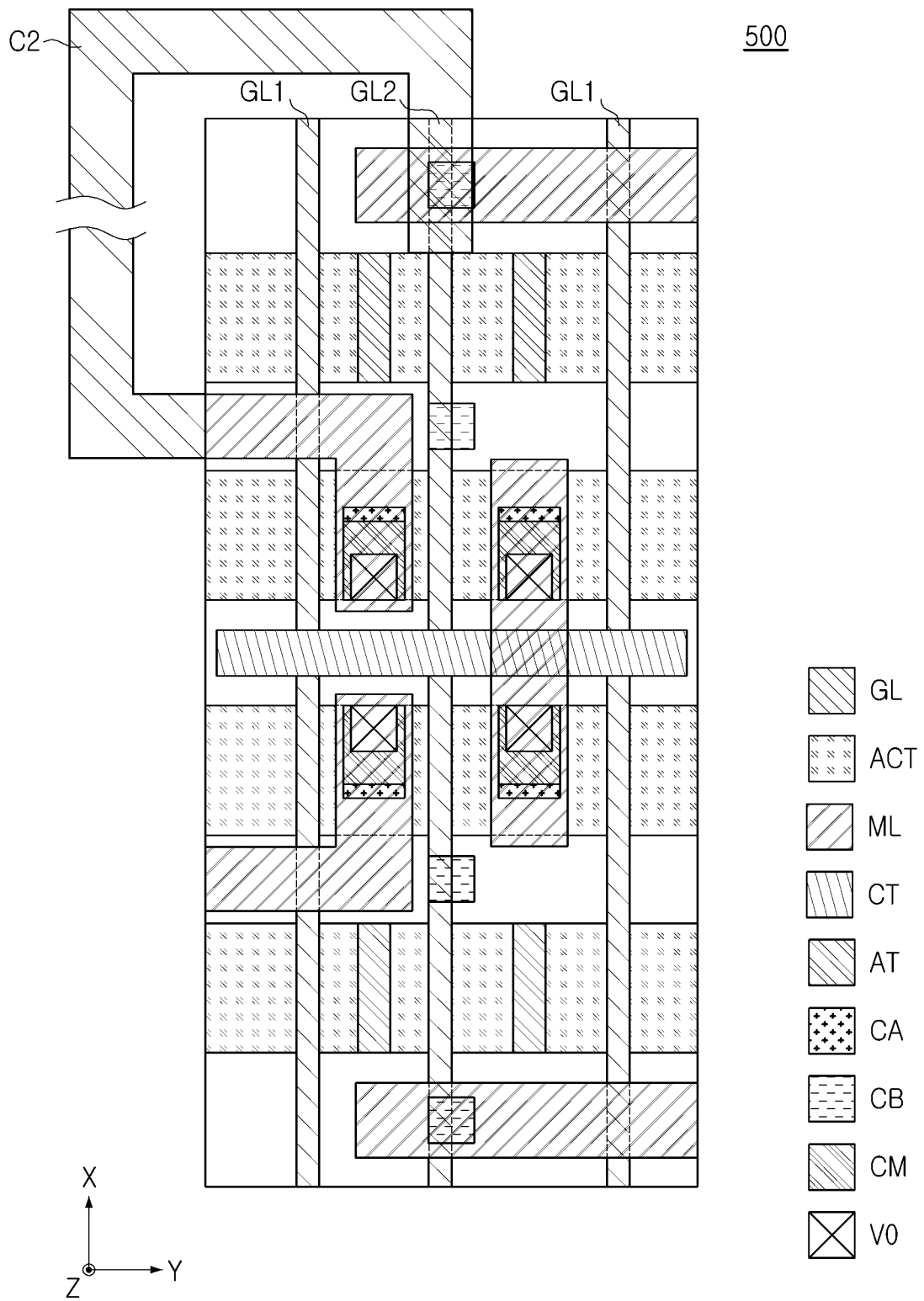

FIGS. 7 and 8 are diagrams that illustrate a test device including a test element group according to an example embodiment.

Referring to FIGS. 7 and 8, test devices 400 and 500 in an example embodiment may include a test element group 200, for example, as illustrated in FIG. 4, and test circuits C1 and C2 for performing a test process. For example, the connection and structure of the test circuits C1 and C2 may be varied depending on a position in which a defect is detected, and embodiments thereof are not necessarily limited to the examples in FIGS. 7 and 8.

Referring to FIG. 7, the test circuit C1 may be electrically connected to a portion of the plurality of metal wirings ML, and resistance of the test transistors may be measured while the plurality of test transistors connected to the test circuit C1 are turned on.

The test element group included in the test device 400 may include a first contact CA connecting each of the plurality of metal wirings ML electrically connected to the test circuit C1 to one of the plurality of active regions ACT. For example, the test device 400 may detect an open defect of the first contact CA by measuring resistance of the plurality of test transistors via the first contact CA.

Referring to FIG. 8, the test circuit C2 may be electrically connected to a portion of the plurality of metal wirings ML, and resistance of the test transistors may be measured while the plurality of test transistors connected to the test circuit C2 are turned on.

The test element group included in the test device 500 may include a first contact CA connecting at least one of the plurality of metal wirings ML electrically connected to the test circuit C2 to one of the plurality of active regions ACT, and may further include a second contact CB connecting at least the other to one of the plurality of gate lines GL.

For example, the test device 500 may detect a defect between the plurality of test transistors GL and the plurality of active regions ACT defining the plurality of test transistors by measuring resistance of the plurality of test transistors via the first contact CA and the second contact CB.

It will be appreciated that the test circuits C1 and C2 illustrated in FIGS. 7 and 8 are merely examples and embodiments thereof are not necessarily limited thereto. For example, the test device in an example embodiment may include a test circuit connected to the test element group in a different manner to detect a defect in the gate oxide.

Figure 9:
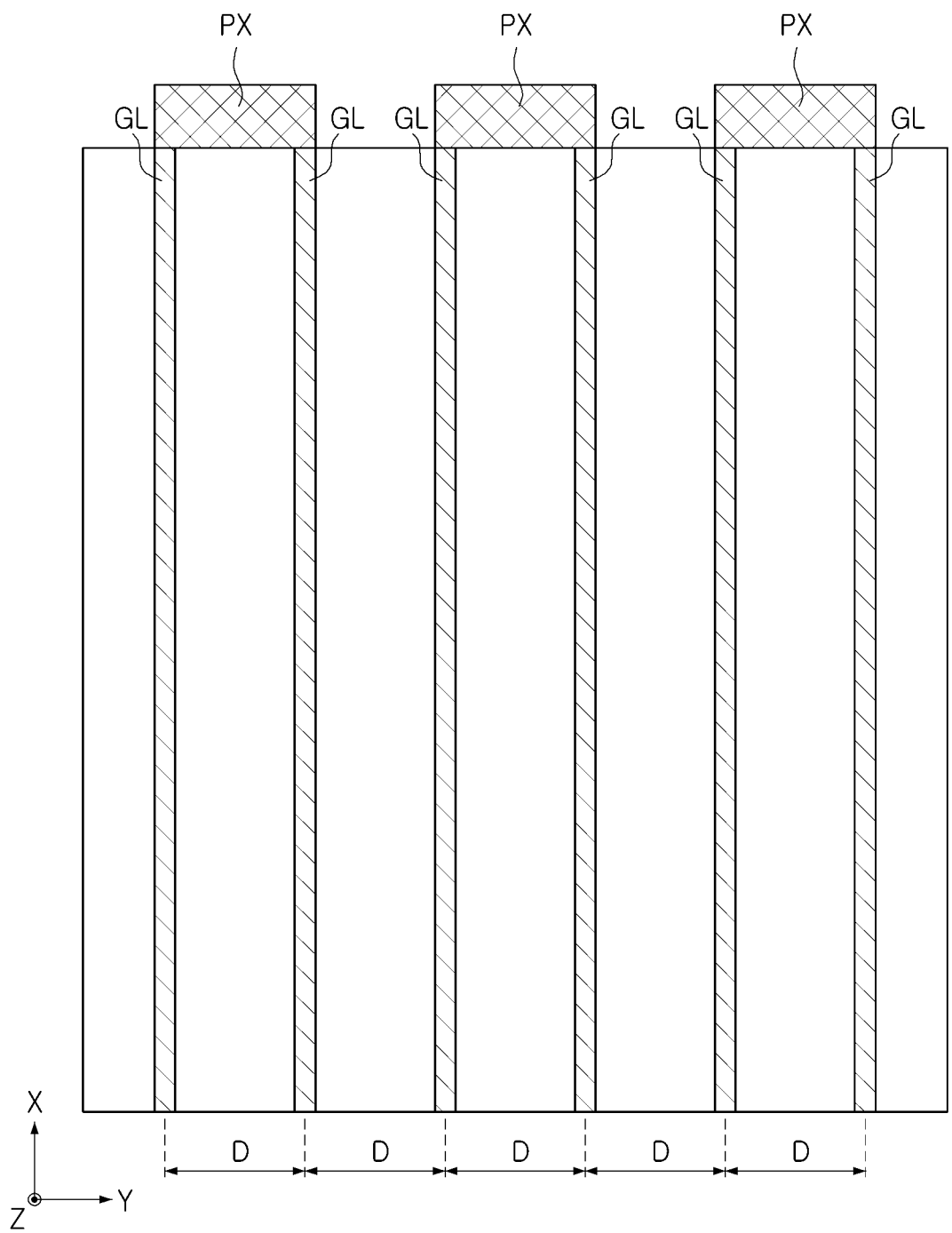
FIGS. 9 to 11 are diagrams that illustrate a process of forming a test element group according to an example embodiment of the present disclosure.
Figure 10:
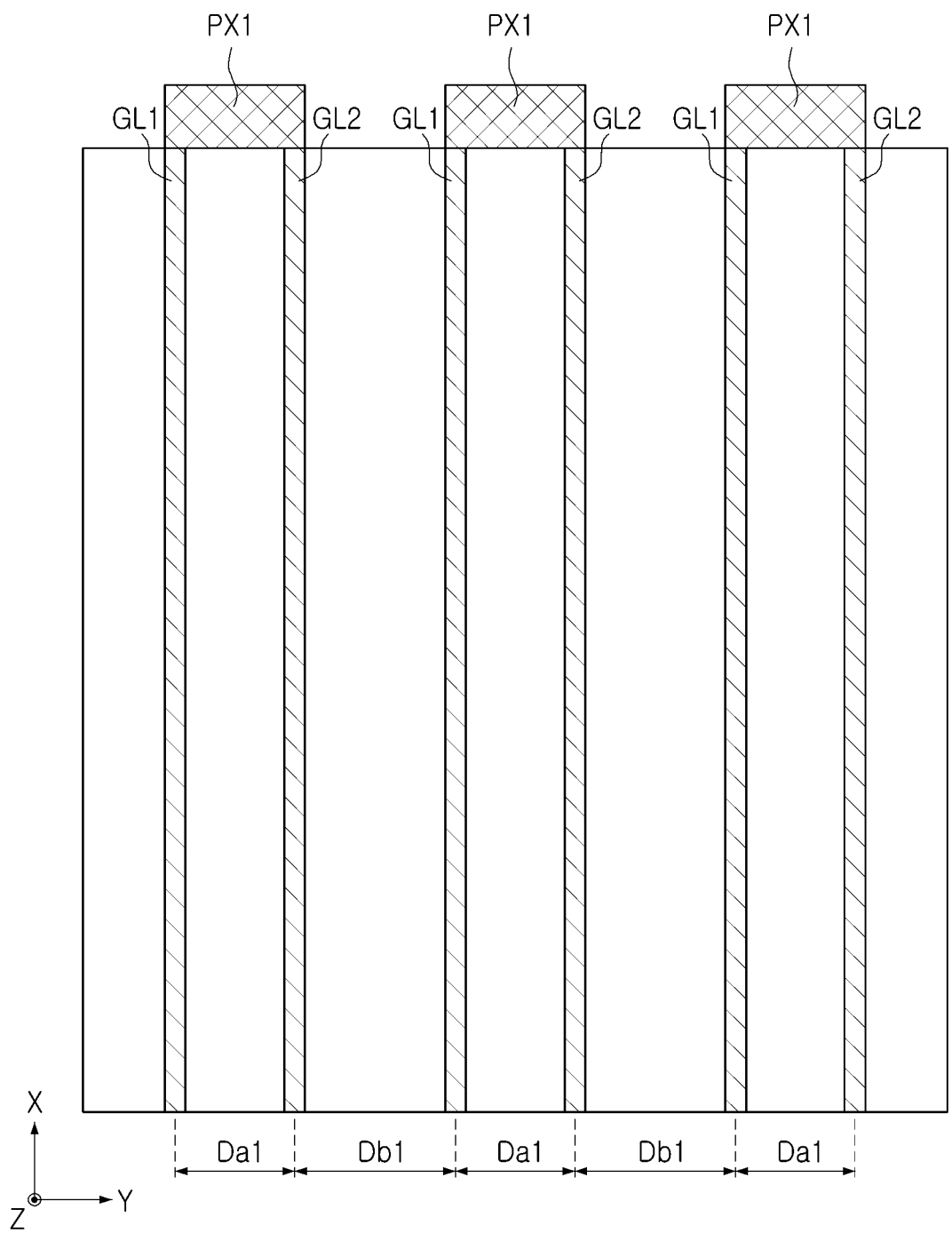
Figure 11:
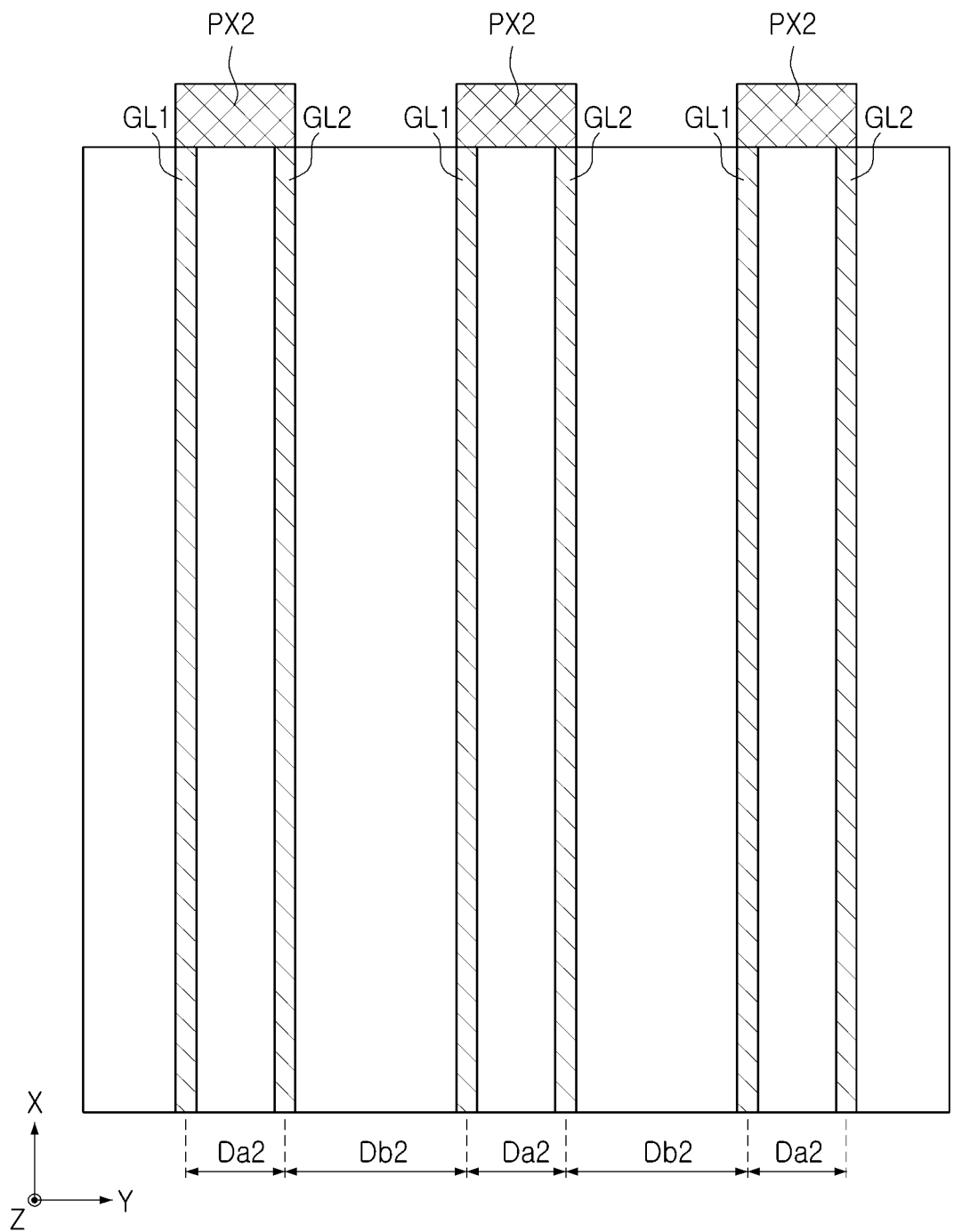

FIGS. 9 to 11 are diagrams that illustrate a process of forming a test element group according to an example embodiment.

Referring to FIGS. 9 to 11, a spacing distance between the plurality of gate lines GL formed in a test element group according to an example embodiment may be determined in various manners.

To determine the spacing distance between the plurality of gate lines GL, a position control pattern PX may be formed before the plurality of gate lines GL are formed. For example, the position control pattern PX may be used to determine the position(s) in which each of the plurality of gate lines GL are formed. Each of the plurality of gate lines GL may be coplanar with both ends of the position control pattern PX and may extend in the first direction (e.g., the X direction).

FIG. 9 is a diagram that illustrates an example of a process of forming a plurality of gate lines GL in the test element group 100 illustrated in FIG. 1. For example, before the plurality of gate lines GL are formed, position control patterns PX having a predetermined width D may be formed on one side of the semiconductor substrate. The position control patterns PX may be spaced apart from each other by a distance equal to the predetermined width D.

The plurality of gate lines GL may be coplanar with both ends of the position control pattern PX. Accordingly, the formed gate lines GL may be spaced apart from each other by the predetermined width D of the position control patterns PX and the spacing distance between the position control patterns PX. In other words, after the formation of the plurality of gate lines GL according to this example process, the plurality of gate lines GL may be spaced apart from each other by the predetermined distance D.

FIGS. 10 and 11 are diagrams that illustrate an example of a process of forming the plurality of gate lines GL1 and GL2 in the test element group 200 illustrated in FIG. 4. In the test element group 200 in an example embodiment, the plurality of gate lines GL1 and GL2 have different spacing distances therebetween. For example, as described above, the different spacing distances may allow a contact defect to be detected earlier in the manufacturing process of a semiconductor device.

Referring to FIG. 10, first position control patterns PX1 which have a different width (e.g., in the second direction Y) from the width of the position control pattern PX illustrated in FIG. 9 may be formed in consideration of the spacing distance between the plurality of gate lines GL1 and GL2 on one side of the semiconductor substrate. For example, the first position control pattern PX1 may have a first width Da1, and for example, the first width Da1 may be less than the predetermined width D of the position control pattern PX illustrated in FIG. 9 by about 0.9 nm to 1.1 nm.

The first position control patterns PX1 may be spaced apart from each other by a first spacing distance Db1, and for example, the first spacing distance Db1 may be greater than the predetermined spacing distance D between the position control patterns PX illustrated in FIG. 9 by about 0.9 nm to 1.1 nm. In embodiments, the sum of the first width Da1 and the first spacing distance Db1 is equal to twice the predetermined width D of the position control pattern PX.

In the test element group 200 in an example embodiment, a first gate line GL1 may be disposed on one end of each of the first position control patterns PX1, and a second gate line GL2 may be disposed on the other end of each of the first position control patterns PX1. Accordingly, the first width Da1 of the first position control pattern PX1 and the first spacing distance Db1 between the first position control patterns PX1 may be the same as the spacing distance between the plurality of first gate lines GL1 and the plurality of second gate lines GL2.

For example, each of the plurality of first gate lines GL1 may be spaced apart from the adjacent second gate line GL2 by the first width Da1 on one side, and may be spaced apart from the second gate line GL2 by the first spacing distance Db1. Accordingly, the test element group 200 manufactured in a process according to an example embodiment may accelerate the formation of a contact defect.

Referring to FIG. 11, in an embodiment, the spacing distance between the plurality of gate lines GL1 and GL2 is not limited to any particular width and may be varied. For example, second position control patterns PX2 having different widths and spacing distances therebetween from those of the first position control patterns PX1 illustrated in FIG. 10 may be formed on one side of the semiconductor substrate. For example, the second position control pattern PX2 may have a second width Da2, and for example, the second width Da2 may be less than the predetermined width D of the position control pattern PX illustrated in FIG. 9 by about 1.9 nm to 2.1 nm.

In embodiments, the second position control patterns PX2 may be spaced apart from each other by a second spacing distance Db2, and for example, the second spacing distance Db2 may be greater than the predetermined spacing distance D between the position control patterns PX illustrated in FIG. 9 by about 1.9 nm to 2.1 nm. In embodiments, the sum of the second width Da2 and the second spacing distance Db2 is equal to twice the predetermined width D of the position control pattern PX.

In the test element group 200 in an example embodiment, a first gate line GL1 may be disposed on one end of each of the second position control patterns PX2, and a second gate line GL2 may be disposed on the other end of each of the second position control patterns PX2. Accordingly, the second width Da2 of the second position control pattern PX2 and the second spacing distance Db2 between the second position control patterns PX2 may be the same as a spacing distance between each the plurality of first gate lines GL1 and each the plurality of second gate lines GL2, respectively.

For example, each of the plurality of first gate lines GL1 may be spaced apart from the adjacent second gate line GL2 by the second width Da2 on one side, and may be spaced apart from the other adjacent second gate line GL2 by the second spacing distance Db2 on the other side. Accordingly, the test element group 200 in an example embodiment may accelerate the formation of a contact defect.

As described above, in FIGS. 9 to 11, a spacing distance between the plurality of gate lines GL may be varied according to a width of the position control pattern PX and a spacing distance between the position control patterns PX. For example, the difference between the width of the position control pattern PX and the spacing distance between the position control patterns PX may be between about 2 nm and 8 nm.

By way of contrast to the test element group 100 illustrated in FIG. 1, in the test element group 200 in an example embodiment, only the positions of the plurality of first gate lines GL1 may be different without any change in the arrangement of the other components formed on the semiconductor substrate. Accordingly, the distance between each of the plurality of first gate lines GL1 and the distance between each of the plurality of second gate lines GL2 illustrated in FIGS. 10 and 11 may be the same, and the these two distances may sum up to equal twice the distance between the plurality of gate lines GL illustrated in FIG. 9.

According to the aforementioned example embodiments, the test device accelerates the occurrence of contact defects using a test element group including a plurality of gate lines spaced apart from each other at different intervals. Since contact defects occur more readily in the test element group, early detection of contact defects outside of the test group may be detected before they are formed in an integrated circuit chip. Further, the early defect detection will allow for information feedback during development. In this way, the test device according to the present disclosure may decrease development time and defect rate in the manufacturing of an integrated circuit chip.

While the example embodiments have been illustrated and described above, it will be apparent to those skilled in the art that modifications and variations may be made thereto without departing from the scope of the present disclosure as defined by the appended claims.

What is claimed is:

1. A test device of a semiconductor device, comprising:
 a semiconductor substrate;
 a plurality of gate lines disposed on an upper surface of the semiconductor substrate and extending in a first direction parallel to the upper surface;
 a test element group including a plurality of test transistors defined by the plurality of gate lines and by a plurality of active regions intersecting the plurality of gate lines and extending in a second direction parallel to the upper surface and perpendicular to the first direction, and further including a plurality of metal wirings disposed on the semiconductor substrate and electrically connected to the plurality of active regions and/or the plurality of gate lines; and
 a test circuit electrically connected to a portion of the plurality of metal wirings and configured to measure resistance of the plurality of test transistors,
 wherein the plurality of gate lines includes a plurality of first gate lines and a plurality of second gate lines, wherein each of the plurality of first gate lines is disposed alternately with each of the plurality of second gate lines, wherein each of the plurality of first gate lines is spaced apart by a first distance from one of the plurality of second gate lines in the second direction on one side, and is spaced apart by a second distance greater than the first distance from another second gate line of the plurality of second gate lines in the second direction on the other side.

2. The test device of claim 1, wherein the test element group includes a first contact configured to connect one of the plurality of active regions to each of the plurality of metal wirings that are electrically connected to the test circuit.

3. The test device of claim 1, wherein the test element group includes a first contact configured to connect one of the plurality of active regions to at least one of the metal wirings electrically connected to the test circuit, and includes a second contact configured to connect one of the plurality of gate lines to another one of the metal wirings electrically connected to the test circuit.

4. The test device of claim 1, wherein the test circuit measures a resistance of the plurality of test transistors before a constituent structure of the semiconductor device is formed on the plurality of metal wirings.

5. The test device of claim 4, wherein the test circuit determines that there is a defect in at least one of the plurality of test transistors when resistance of the plurality of test transistors is greater than about 30 kΩ.

6. The test device of claim 4, wherein the test circuit detects a defective transistor based on a connection structure of the plurality of test transistors according to a magnitude of the measured resistance.

7. The test device of claim 4, wherein the plurality of test transistors each have a same structure.

8. The test device of claim 1, wherein each of the plurality of test transistors are connected to each other in series by the plurality of metal wirings.

9. The test device of claim 1, wherein a first contact extending in a third direction perpendicular to the first and second directions and penetrating into a portion of each of the plurality of active regions is disposed on the plurality of active regions, and
wherein, a length in the third direction of the first contact disposed between a pair of the plurality of gate lines spaced apart from each other by a first distance is less than a length in the third direction of the first contact disposed between another pair of the plurality of gate lines spaced apart from each other by a second distance.

10. The test device of claim 1, wherein a first contact extending in a third direction perpendicular to the first and second directions and equally spaced apart from adjacent gate lines among the plurality of gate lines is disposed in each of the plurality of active regions.

11. A test element group, comprising:
a plurality of gate lines extending in a first direction parallel to an upper surface of a semiconductor substrate, and including a plurality of first gate lines and a plurality of second gate lines, wherein each of the plurality of first gate lines is disposed alternately with each of the plurality of second gate lines;
a plurality of test transistors defined by the plurality of gate lines;
a plurality of active regions intersecting the plurality of gate lines and spaced apart from each other in the first direction; and
a plurality of metal wirings disposed on the semiconductor substrate and electrically connected to the plurality of active regions and/or the plurality of gate lines,
wherein each of the plurality of first gate lines is spaced apart by a first distance from one of the plurality of second gate lines on one side, wherein each of the plurality of first gate lines is spaced apart by a second distance greater than the first distance from another one of the plurality of second gate lines on the other side in the second direction, and wherein the second direction is parallel to the upper surface of the semiconductor substrate and perpendicular to the first direction, and a sum of the first distance and the second distance has a predetermined value regardless of a location of the first gate line.

12. The test element group of claim 11, wherein a difference between the first distance and the second distance is between 2 nm and 8 nm.

13. The test element group of claim 11, wherein each of the plurality of test transistors includes at least one fin structure providing the plurality of active regions.

14. The test element group of claim 11, wherein each of the plurality of test transistors includes at least one nanosheet providing the plurality of active regions.

15. A test element group, comprising:
a plurality of gate lines extending in a first direction parallel to an upper surface of a semiconductor substrate and including a plurality of first gate lines and a plurality of second gate lines, wherein each of the plurality of first gate lines is disposed alternately with each of the plurality of second gate lines;
a plurality of test transistors defined by the plurality of gate lines, and by a plurality of active regions intersecting the plurality of gate lines, the plurality of active regions spaced apart from each other in the first direction;
a plurality of metal wirings disposed on the semiconductor substrate and electrically connected to the plurality of active regions and/or the plurality of gate lines; and
a plurality of contacts connecting at least one of the plurality of metal wirings to at least one of the plurality of active regions,
wherein each of the plurality of first gate lines is spaced apart by a first distance from one of the plurality of second gate lines on one side in a second direction, and is spaced apart by a second distance greater than the first distance from another one of the plurality of second gate lines on the other side in the second direction, wherein the second direction is parallel to the upper surface of the semiconductor substrate and perpendicular to the first direction, and wherein a distance between adjacent contacts among the plurality of contacts is different from the first distance and the second distance.

16. The test element group of claim 15, wherein the distance between adjacent contacts is constant for all adjacent contacts among the plurality of contacts.

17. The test element group of claim 15, wherein the plurality of gate lines is formed based on the configuration of a plurality of position control patterns formed on one side of the semiconductor substrate in the first direction.

18. The test element group of claim 17, wherein a length of each of the plurality of position control patterns in the second direction determines the first distance.

19. The test element group of claim 17, wherein a distance between each of the plurality of position control patterns determines the second distance.

20. The test element group of claim 17, wherein the length of each of the plurality of position control patterns in the second direction is the same, and wherein spacing distances between each of the plurality of position control patterns are the same.

* * * * *